United States Patent
Coskun et al.

(10) Patent No.: US 7,818,151 B2
(45) Date of Patent: Oct. 19, 2010

(54) METHOD, PROGRAM PRODUCT AND APPARATUS FOR OBTAINING SHORT-RANGE FLARE MODEL PARAMETERS FOR LITHOGRAPHY SIMULATION TOOL

(75) Inventors: Tamer Coskun, Cupertino, CA (US); Sangbong Park, Union City, CA (US); Jang Fung Chen, Cupertino, CA (US); Bernd Geh, Scottsdale, AZ (US)

(73) Assignee: ASML MaskTools B.V., Veldhoven (NL)

( * ) Notice: Subject to any disclaimer, the term of this patent is extended or adjusted under 35 U.S.C. 154(b) by 678 days.

(21) Appl. No.: 11/415,423

(22) Filed: May 2, 2006

(65) Prior Publication Data
US 2007/0260437 A1 Nov. 8, 2007

(51) Int. Cl.
*G06F 17/50* (2006.01)
(52) U.S. Cl. ............................................. 703/6; 716/21
(58) Field of Classification Search .................... 703/2, 703/6; 716/4, 19–21
See application file for complete search history.

(56) References Cited

U.S. PATENT DOCUMENTS

| | | | |
|---|---|---|---|
| 5,969,441 A | 10/1999 | Loopstra et al. | |
| 6,046,792 A | 4/2000 | Van Der Werf et al. | |
| 6,470,489 B1 * | 10/2002 | Chang et al. | 716/21 |
| 7,199,863 B2 * | 4/2007 | Bruls et al. | 355/69 |
| 7,422,829 B1 * | 9/2008 | Babcock et al. | 430/5 |
| 7,470,504 B2 * | 12/2008 | Lai et al. | 430/311 |
| 2004/0017574 A1 * | 1/2004 | Vuong et al. | 356/625 |
| 2005/0102648 A1 * | 5/2005 | Hsu et al. | 716/19 |
| 2006/0132749 A1 * | 6/2006 | Bruls et al. | 355/69 |

OTHER PUBLICATIONS

Chris A. Mack, "Measuring and Modeling Flare in Optical Lithography" Proceedings of SPIE, 2003, pp. 151-161.*
Stearns et al. "Nonspecular x-ray scattering in a multilayer-coated imaging system", Journal of Applied Physics, vol. 84, No. 12, pp. 1003-1028, Jul. 15, 1998.
Stover, Harry L. "Optical Microlithography VI", Proceedings of SPIE—The International Society for Optical Engineering, pp. 6-20, Mar. 4-5, 1987.

* cited by examiner

*Primary Examiner*—Dwin M Craig
(74) *Attorney, Agent, or Firm*—Pillsbury Winthrop Shaw Pittman LLP

(57) ABSTRACT

A process of obtaining short-range flare model parameters representing a short-range flare which degrades a contrast of an image generated by a lithography tool, is disclosed. Short-range flare is measured from the image to obtain measured short-range flare data. A simulation is performed based on short-range flare model parameters to obtain simulated short-range flare data. The simulated short-range flare data is compared with the measured short range flare data. It is determined whether the short-range flare model parameters used in the simulation is appropriate based on the comparison result. The short-range flare model parameters is optimized according to the measured short-range data and the simulated short-range flare data if the short-range flare model parameters used for the simulation is not appropriate.

16 Claims, 7 Drawing Sheets

Intensity plots with and without flare

CD-through-pitch curves with and without flare

METHOD, PROGRAM PRODUCT AND APPARATUS FOR OBTAINING SHORT-RANGE FLARE MODEL PARAMETERS FOR LITHOGRAPHY SIMULATION TOOL

TECHNICAL FIELD

This disclosure relates generally to lithographic simulation tools. More particularly, it relates to extraction of short-range flare model parameters from measured data on a lithographic tool, which are then utilized in subsequent simulations.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally >1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "optics;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. A critical dimension of a circuit can be defined as the smallest width of a line or hole or the smallest space between two lines or two holes. Thus, the CD determines the overall size and density of the designed circuit.

Due to an accuracy requirement for optical proximity correction (OPC) at very low k1 (<0.4), more accurate representation of the performance of the exposure tool in simulations has become critical to accommodate the reduction of device pattern dimensions. To satisfy such a requirement, one of the effects required to be taken into account in the simulation process is the flare occurring in the imaging process. Flare, which is unwanted scattered light arriving at a wafer, is caused by anything that forces the light to travel in a non-ray trace direction. The flare increases the background intensity and results in reduction in the image contrast, thereby degrading the pattern fidelity and CD uniformity. The amount of flare experienced by any given feature is a function of both the local environment around that feature (short-range flare) and the total amount of energy going through the lens (long-range flare). The short-range flare can degrade image contrast and, if varied across the field, can contribute to across-field CD variation. For example, imperfection in a lens such as surface roughness affects short-range flare.

FIG. 1 shows how short-range flare can undesirably reduce the contrast of an image, which will in turn negatively effect the resist profile. FIG. 2 shows the CD-through-pitch behavior of an illumination system with and without short-range flare. These figures show that when the flare effect is included in the simulation, the contrast of the resulting image is reduced. Accordingly, if optical proximity correction (OPC) rules are generated from simulation results that do not take flare into account, the actual imaging results may not satisfy the imaging requirements. Indeed, as minimum CD requirements continue to be reduced, it will become increasingly necessary to have a simulation model that accurately compensates for the effects of flare.

Therefore, it is an object of the present invention to provide a method that accurately accounts for short-range flare in the simulation process so as to obtain more accurate simulation result.

SUMMARY

This disclosure relates to a method, computer program product and apparatus for obtaining short-range flare model parameters from measured data on a lithographic tool. The short-range flare model parameters are then incorporated into the simulation tool, and utilize in subsequent simulations. In accordance with the present invention, short-range flare is measured from an actual image obtained by utilizing the given lithographic tool to obtain measured short-range flare data. A simulation based on short-range flare model parameters is performed to obtain simulated short-range flare data. The simulated short-range flare data is compared with the measured short-range flare data (i.e., flare data obtained from the actual image). It is determined whether the short-range flare model parameters used in the simulation are appropriate based on the result of this comparison. The short-range flare model parameters are then optimized such that the simulated short-range flare data matches the measured short-range flare data within a predefined error tolerance. It is noted that the acceptable error tolerance will vary based on, for example, the imaging tool being utilized and the minimum CD requirements for the given process. Once the short-range flare data and the measured flare data matches within the predefined tolerance, the short range flare parameters associated with this short-range flare data are set as the short-range flare parameter to be utilized in the simulation.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as being replaced by the more general terms "mask," "substrate" and "target portion," respectively.

The invention itself, together with further objects and advantages, can be better understood by reference to the following detailed description and the accompanying drawings.

DESCRIPTION

A process of obtaining optimized short-range flare model parameters for use in a lithography simulation and/or simulator in accordance with the present invention will be described with reference to the accompanying drawings. It is noted that since short-range flare is specific to a given lithographic process tool, the process has to be run for each given lithographic tool. In other words, if the lithographic process to be simulated is changed, the short-range flare model parameters must be recalculated for the new lithographic process.

Short-range flare is typically characterized utilizing Power Spectral Density (PSD) in simulators. Derivation of imaging formula in the presence of flare is described by, for example, D. G. Stearns, D. P. Gaines, and D. W. Sweeney, "Nonspecular x-ray scattering in a multiplayer-coated imaging system," Appl. Opt. 84, 1003-1028 1998, incorporated herein by reference. The degraded image due to flare is given by:

$$I_{FL}(r) = (1-\sigma^2 - D)I(r) + PSD(r) \otimes I(r) + D \quad \text{Equation 1}$$

where PSD models the short-range flare, r indicates a radius (a distance from a point), D is the long-range or DC flare, and $\sigma^2$ is the phase error variance and can be calculated by integrating the PSD. The PSD represents the power or the intensity of the light at a given point in an image. In other words, the PSD indicates the influence that surrounding points have on the illumination intensity for the given point in the spatial domain.

Several PSD functions have been proposed. They include a Gaussian model, an ABC or K-correlation model, and a fractal model. It is noted that combinations of, and multiple versions of, these functions can be used to describe more complicated behaviors of the short-range flare.

For example, an exemplary ABC model is provided below:

$$PSD(r) = \frac{A}{[1+(Br)^2]^{(C+1)/2}} \quad \text{Equation 2}$$

Figure 3:
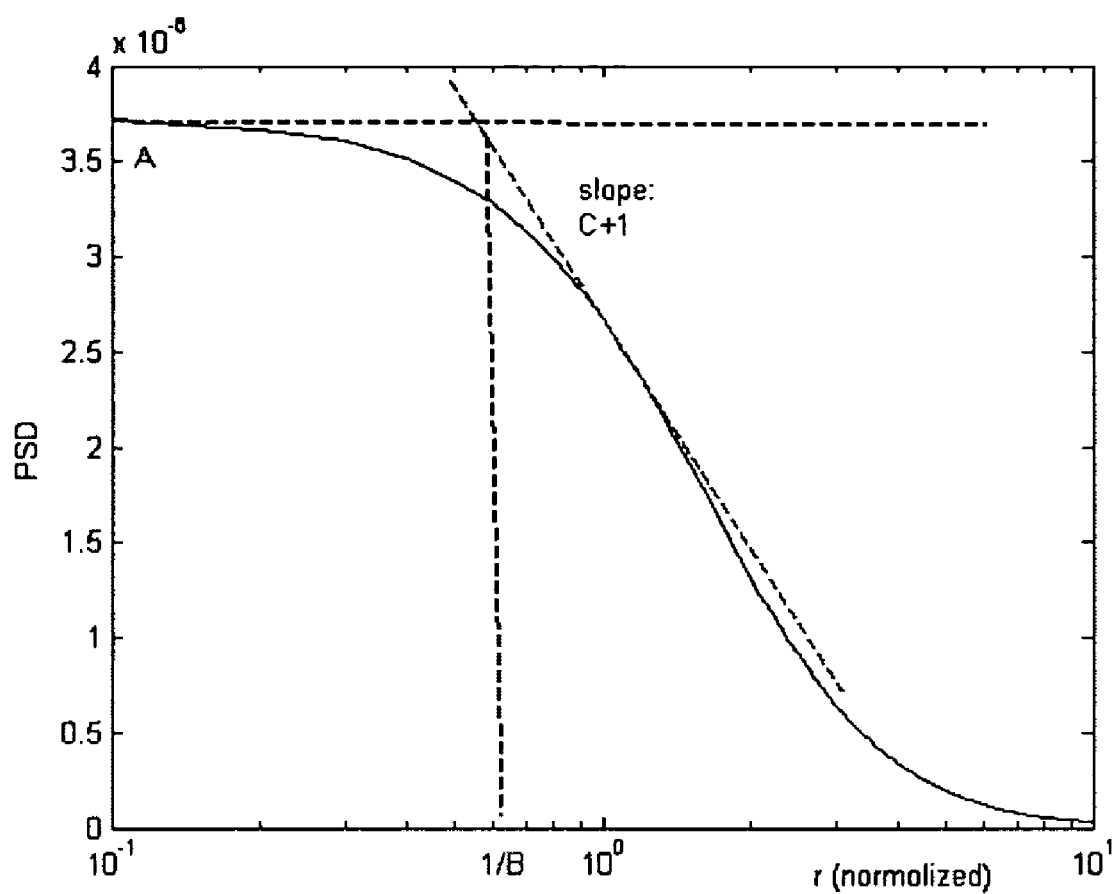
FIG. 3 is an exemplary graph explaining short-range flare parameters (ABC parameters).

FIG. 3 are exemplary plots useful for explaining the ABC parameters set forth in Equation 2. Parameters A, B and C determine the shape of the curve in FIG. 3. Parameter A corresponds to the value of the horizontal asymptote, parameter B is the reciprocal of the distance at the intersection of both asymptotes, and parameter C+1 is the negative slope of the inclined line. The function described by Equation 2 is a decaying function with the increase of r. In this example, the ABC parameters are used as short-range flare model parameters.

Figure 4:
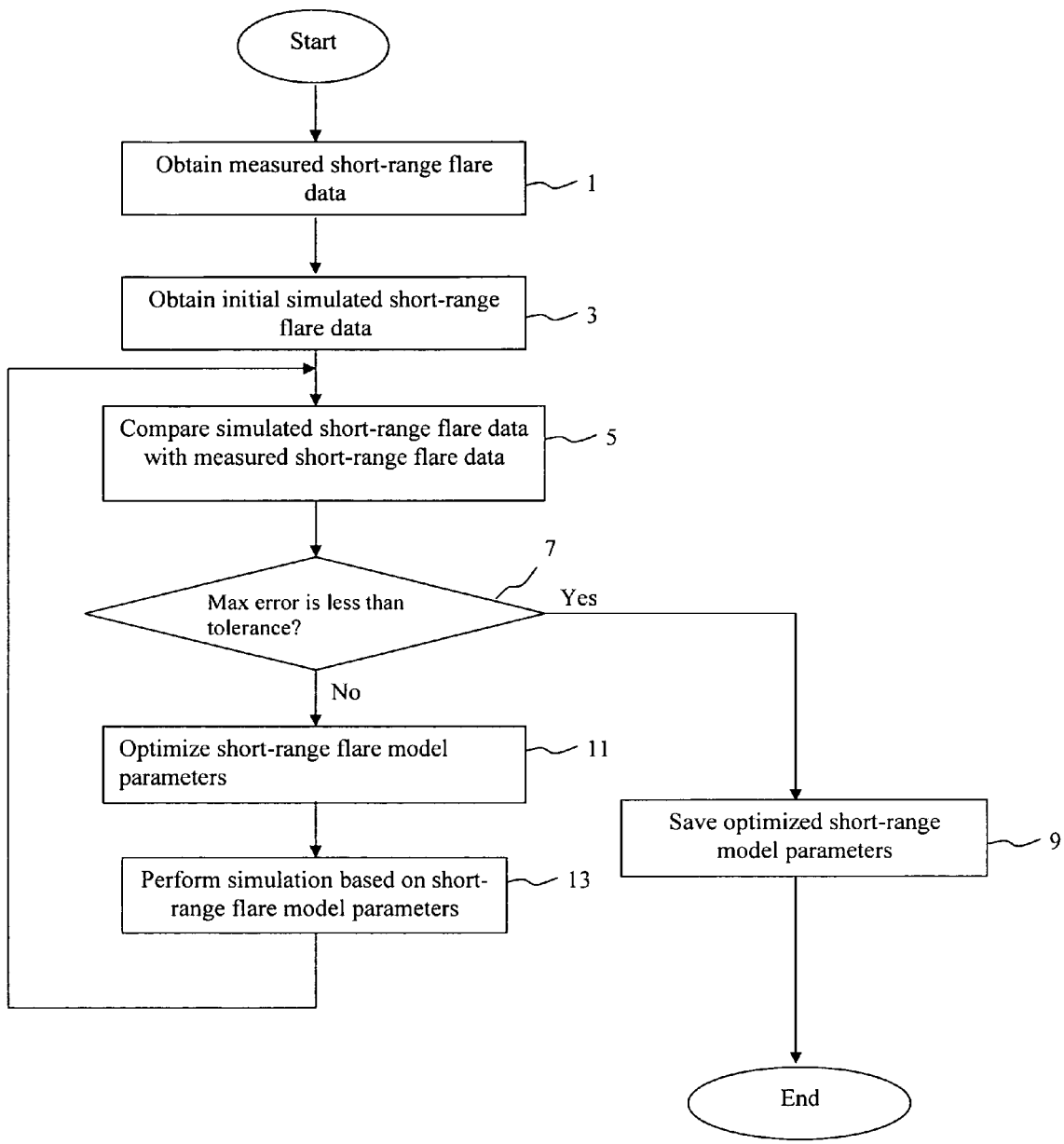
FIG. 4 is an exemplary flowchart illustrating a process of obtaining optimized short-range flare model parameters in accordance with an embodiment of the present invention.
Figure 5:
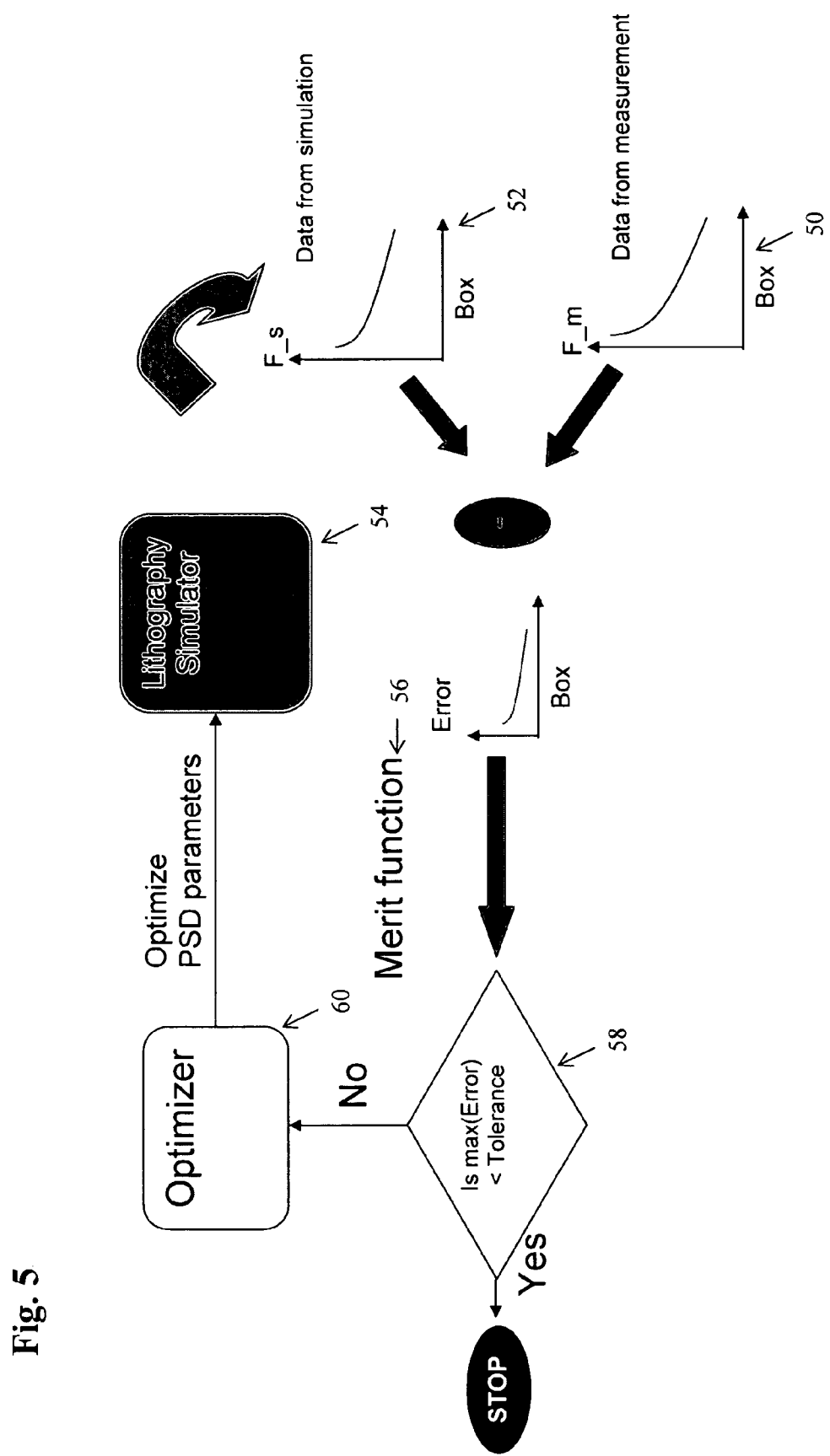
FIG. 5 is an exemplary diagram visually illustrating the process shown in FIG. 4.

FIG. 4 is an exemplary flowchart illustrating a process of obtaining optimized short-range flare model parameters. FIG. 5 is an exemplary diagram visually illustrating the process shown in FIG. 4. It is noted that the short-range flare model parameters, e.g., ABC parameters in Equation 2, are obtained from measured data on a given lithography tool using a given process.

As noted, the first step in the process, step 1, is to obtain measured data regarding short-range flare for the given illumination tool and process. Widely used methods to measure short-range flare are the disappearing-box test and sensor based tests. The disappearing-box test is described by, for example, J. P. Kirk, "Scattered light in photolithographic lenses," Proc. SPIE 2197, 566-572 1994, and D. G. Flagello and A. T. S. Pomerene, "Practical characterization of 0.5 um optical lithography," Proc. SPIE 772, 6-20 1987, incorporated herein by reference.

In the disappearing-box text, several Cr boxes with different sizes, instead of a mask, are exposed with a step-by-step dose (light) increase until the resist image completely disappears for each box. The image of each Cr box is printed on a wafer, and based on the results, short-range flare is measured. At the beginning, the Cr boxes can be seen on the wafer. However, when the dose is increased, the images of the Cr boxes on the wafer shrink because light leaks under the boxes (flare). Light leaking underneath the boxes eliminates the images of the box from the resist image.

According to this disappearing-box test, the measured flare is defined as a function of each box size by:

$$F_m(\text{box\_size\_j}) = \frac{E_0}{E_{\text{clear\_box}}(\text{box\_size\_j})} \times 100 \qquad \text{Equation 3}$$

where $E_{clear\_box}$ is a dose value at which the printed box on the wafer disappears, and $E_0$ is the dose necessary to clear the resist when the mask is blank. The measured flare data is plotted, and a measured flare versus box size curve 50 shown in FIG. 5 is obtained.

In the sensor based method, several Cr boxes are exposed and a Total Integrated Scattering (TIS) sensor provided in the lithography tool measures the amount of light under each box. The ratio of the light under the box (I(box_size_j)) to the light measured without a box (I (0)) gives the amount of short-range flare, which is defined by:

$$F_m(\text{box\_size\_J}) = \frac{I(\text{box\_size} - j)}{I(0)} \times 100 \qquad \text{Equation 4}$$

Similar to the disappearing box test, the amount of short-range flare is plotted for each box, and a flare versus box size curve 50 as shown in FIG. 5 is obtained.

Although there is no specific formula that relates the measured data to the PSD (ABC parameters), as explained below, the disclosed process uses numerical experiments and genetic parameter extraction algorithms to obtain calibrated short-range flare model parameters, e.g., the calibrated ABC parameters from measured flare versus box size curve 50.

Assuming that the measured flare versus box size curve 50 is obtained by the sensor based methods, in this example, the data might have been strored, but not limited to, in a SAMOS (Stray Light At Multiple Opaque Squares) data format. As noted, the sensor based method is an aerial image based test that uses a spot sensor to measure the amount of short-range flare for a certain box size.

Once the measured short-range flare data is obtained, the next step in the process, step 3, is to obtain an initial simulated flare versus box size curve 52 (i.e., initial simulated short-range flare data), as shown for example in FIG. 5. As described below, a lithography simulator 54 may perform a simulation based on initial ABC parameters and output a simulated flare versus box size curve 52. The initial ABC parameters may be set by a user. A D parameter, i.e., long-range flare, can also be used for the simulation (see, Equation 1). For example, long-range flare data can be obtained by use of a box much larger than that used for the measurement of the short-range flare. The box for the long-range flare measurement covers almost all area to be exposed. The long-range flare data can be obtained from the results of such a measurement. Once the initial values are determined, a simulation is performed so as to produce simulated short-range flare data, which is used to generate a simulated flare versus box size curve 52, as described in more detail below.

The next step in the process, step 5, is to compare simulated flare versus box size curve 52 with measured flare versus box size curve 50. This comparison may be performed by use of a merit function 56. Examples of merit function 56 are a maximum error function ("max") and a Root-Mean-Square ("RMS"). An output of step 5 may be a maximum error according to the comparison result. In more detail, step 5 compares intensity F_s with intensity F_m on a point by point basis (i.e. for each box size). The difference between intensity F_s and intensity Fm is the error for each box size.

The next step in the process, step 7, is to determine whether the maximum error is less than a predefined tolerance set, for example, by an operator (see, also reference numeral 58 in FIG. 5). When the maximum error is determined to be less than the predefined tolerance, the process goes to step 9 and saves the ABC parameters so that they may be utilized in a subsequent simulation process as the calibrated short-range flare model parameters.

On the other hand, when it is determined that the maximum error is not less than the tolerance, the process goes to step 11. In step 11, an optimizer 60 receives the measured flare versus box size curve 50 and the current simulated flare versus box size curve 52, and outputs a new set of the ABC parameters to lithography simulator 54, which are intended to provide a closer match between measured flare versus box size curve 50 and simulated flare versus box size curve 52.

Optimizer 60 may be implemented, for example, by a genetic algorithm-based parameter extraction. The genetic algorithm has been well known method used to solve problems such as optimizations with a computer simulation. Optimizer 60 generates some random numbers for the ABC parameters (a pair for each parameter) within a certain range defined by the user. Then, optimizer 60 provides these ABC parameters to lithography simulator 54. Every time step 7 determines that a maximum error is not less than the predefined tolerance, optimizer 60 generates another set of the parameters and provides them to simulator 54.

Selection of new parameters involves, for example, initialization, mutation, crossover, and comparison. The initialization procedure is the initial stage where a pair of numbers (parents) for each parameter is generated. The mutation and crossover generates two new numbers (children) for each parameter. Depending on the merit function, the best candidates are selected and worst ones are eliminated (comparison). Sometimes, some portion of the average ones may be kept with the possibility that they may generate better solutions.

Then, the next step in the process, step 13, is to perform a new simulation based on the updated ABC parameters to generate a new simulated flare versus box size curve 52. Lithography simulator 54 may receive the ABC parameters from optimizer 60, and also receives the D data (long-range flare, discussed above). It is noted that typical simulators 54 can perform numerical experiments that operate on these parameters and produce the simulated flare versus box size curve (function) 52. One such simulator is ASML's LithoCruiser™.

Lithography simulator 54 may use Equation 1 to obtain simulated flare versus box size curve (function) 52. Intensity I(r) is calculated based on the given process, including but not limited to, the components (illuminator, reticle, etc.), process conditions (NA, polarization, etc.) and effects (aberration, etc.), except flare. Then, this intensity is applied to Equation 1 to obtain the modified intensity in consideration of the flare.

Figure 6:
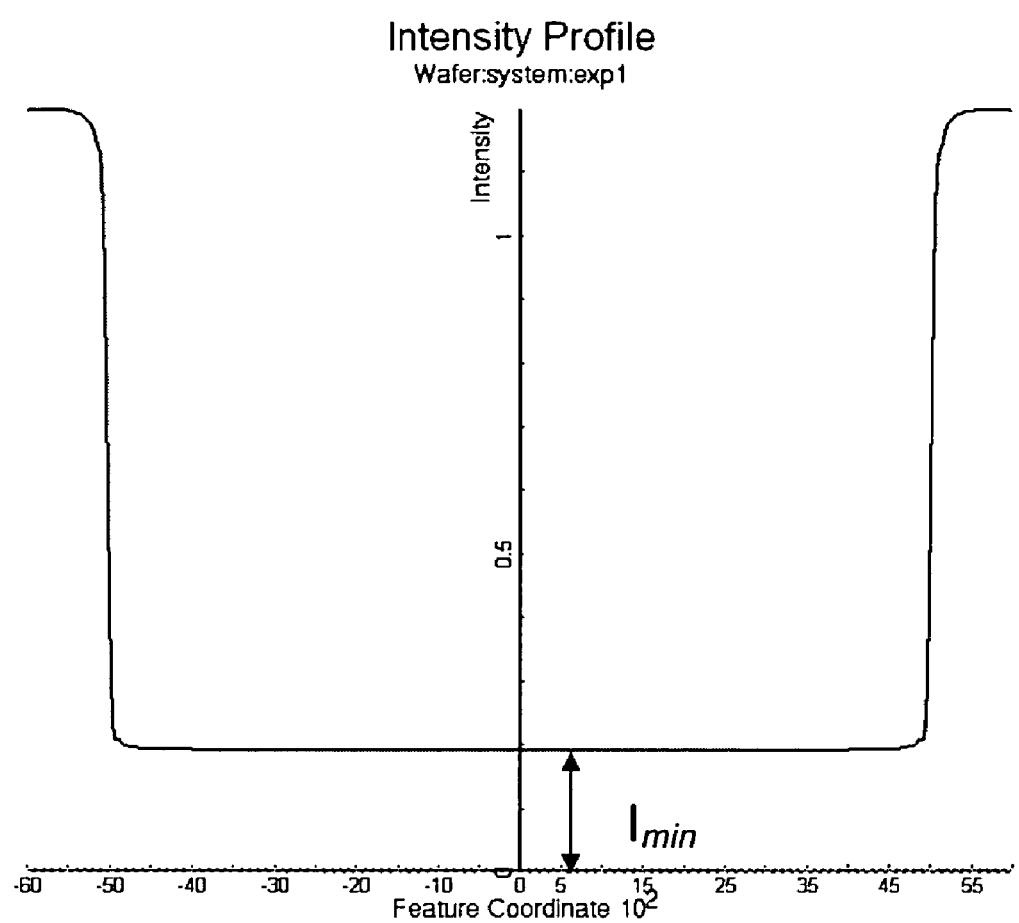
FIG. 6 is an exemplary graph illustrating the light intensity as a function of location in accordance with an exemplary embodiment of the present invention.

This modified intensity is, then, utilized to estimate the amount of flare as shown in FIG. 6. Since $I_{FL}(r)$ in Equation 1 is a function of r (radius), the plots of the intensity of the flare relative to the position of a box can be obtained as shown in FIG. 6. Intensity $I_{min}$ in FIG. 6 is the minimum amount of $I_{FL}(r)$ of Equation 1 for a given box size. If there is no light underneath the box (no flare), minimum intensity I_min should ideally be zero. In the case of FIG. 6, minimum intensity $I_{min}$ is considered to be the flare contribution, and is plotted as flare F_s in the simulated flare versus box size curve 52. For the intensity profile shown in FIG. 6, the flare is given by:

$$F_s(\text{box\_size\_}j) = I_{min}(\text{box\_size\_}j) / I_{max}(\text{box\_size\_}j) \times 100 \qquad \text{Equation 5}$$

This procedure is repeated for each box size (this will change only the reticle) to generate simulated flare versus box curve (function) 52.

The process returns to step 5 to compare the new simulated flare versus box size curve 52 with measured flare versus box size curve 50. If a maximum error is less than the tolerance, the process saves the ABC parameters used to generate currently used simulated flare versus box size curve 52. Otherwise, optimizer 60 generates another set of the parameters and provides them to simulator 54 again, and the foregoing process is repeated.

The calibrated short-range flare model parameters can be used to improve accuracy of a lithography simulation such as resist model calibration. For example, the short-range flare model parameters may be used, to calculate an aerial image for a feature in question based on the optical settings of an exposure tool, which include, for example, numerical aperture, exposure wavelength, etc.

Extracted short range flare model parameters can be also used in proximity matching. Proximity matching is a technique to match the Optical Proximity Effect (OPE) of a given lithography system to the OPE of a reference lithography system of the same type such that the difference of the Critical Dimension (CD)-through-pitch curve of the system to be matched with respect to the CD-through-pitch curve of the reference system meets a given proximity-matching control limit. It is known that flare characteristic changes from system to system. While the feature sizes are getting smaller, even small change on the CD due to flare or other effects is getting more important. By considering the flare deviation from reference system, one can take an action to correct it, if the CD change is not within acceptable limits.

Figure 1:
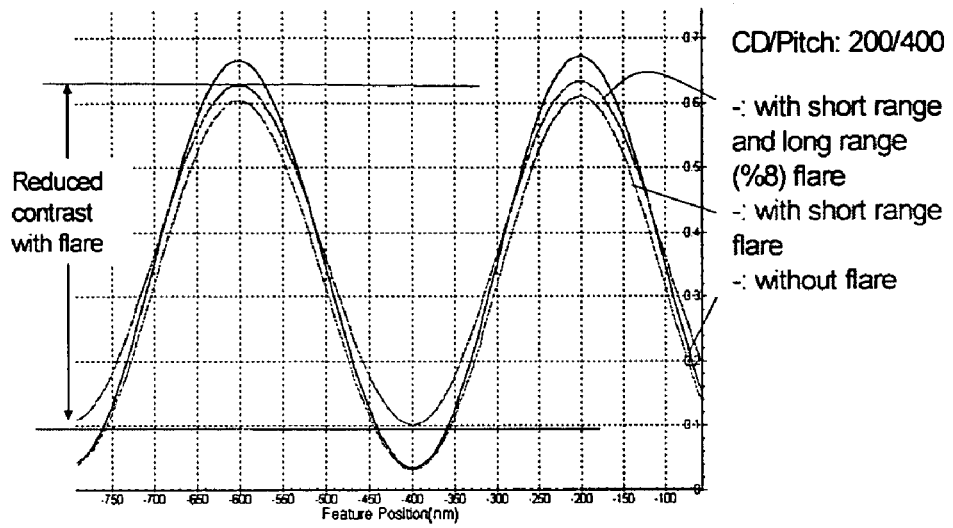
FIG. 1 is an exemplary graph illustrating the resulting image contrast for a given process with and without flare.
Figure 2:
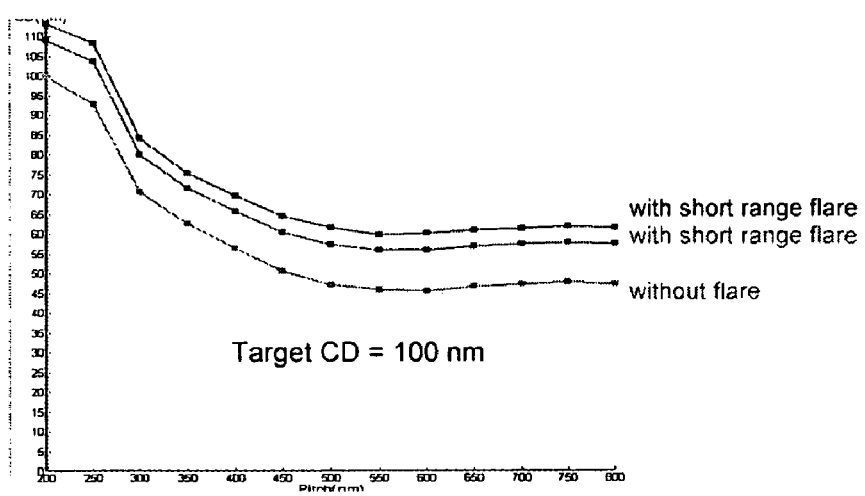
FIG. 2 are exemplary CD-through-pitch curves for a given process with and without flare.

According to the embodiment described above, it is possible to obtain calibrated short-range flare model parameters from measured data on a given lithography tool. Once the short-range flare parameters are extracted, these parameters can be utilized in a simulation process to provide a more accurate estimate of the actual resulting image. As clearly shown in FIGS. 2 and 3, performing lithographic simulations in consideration of the short-range flare model parameters provides more accurate simulation results. Furthermore, the disclosed process of obtaining short-range flare model parameters can provide the following advantages: (1) to extract flare model parameters to use in OPC rule generation; (2) to extract flare model parameters to analyze the performance variation from system to system due to flare; (3) to allow monitoring CD Uniformity (CDU) over the field; and (4) to help in decision process on the system selection for a given application.

Figure 7:
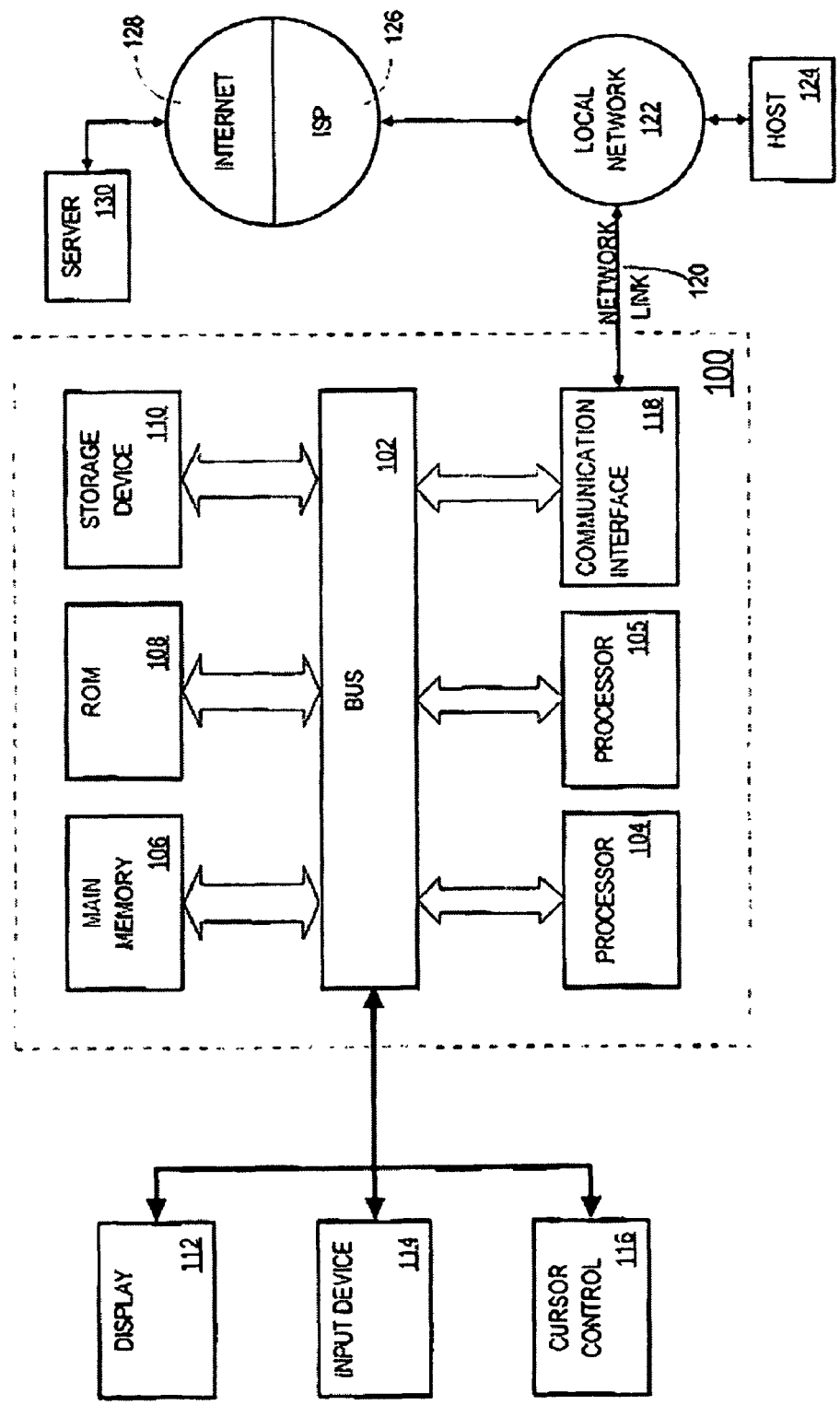
FIG. 7 is a block diagram that illustrates a computer system which can implement a process of obtaining optimized short-range flare model parameters according to an embodiment of the present invention.

FIG. 7 is a block diagram that illustrates a computer system 100 which can implement the disclosed process explained above. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, the disclosed process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the disclosed process of the embodiment, for example. The received code may be executed by processor 104 as it is received, and/or stored in storage device 110, or other non-volatile storage for later execution. In this manner, computer system 100 may obtain application code in the form of a carrier wave.

Figure 8:
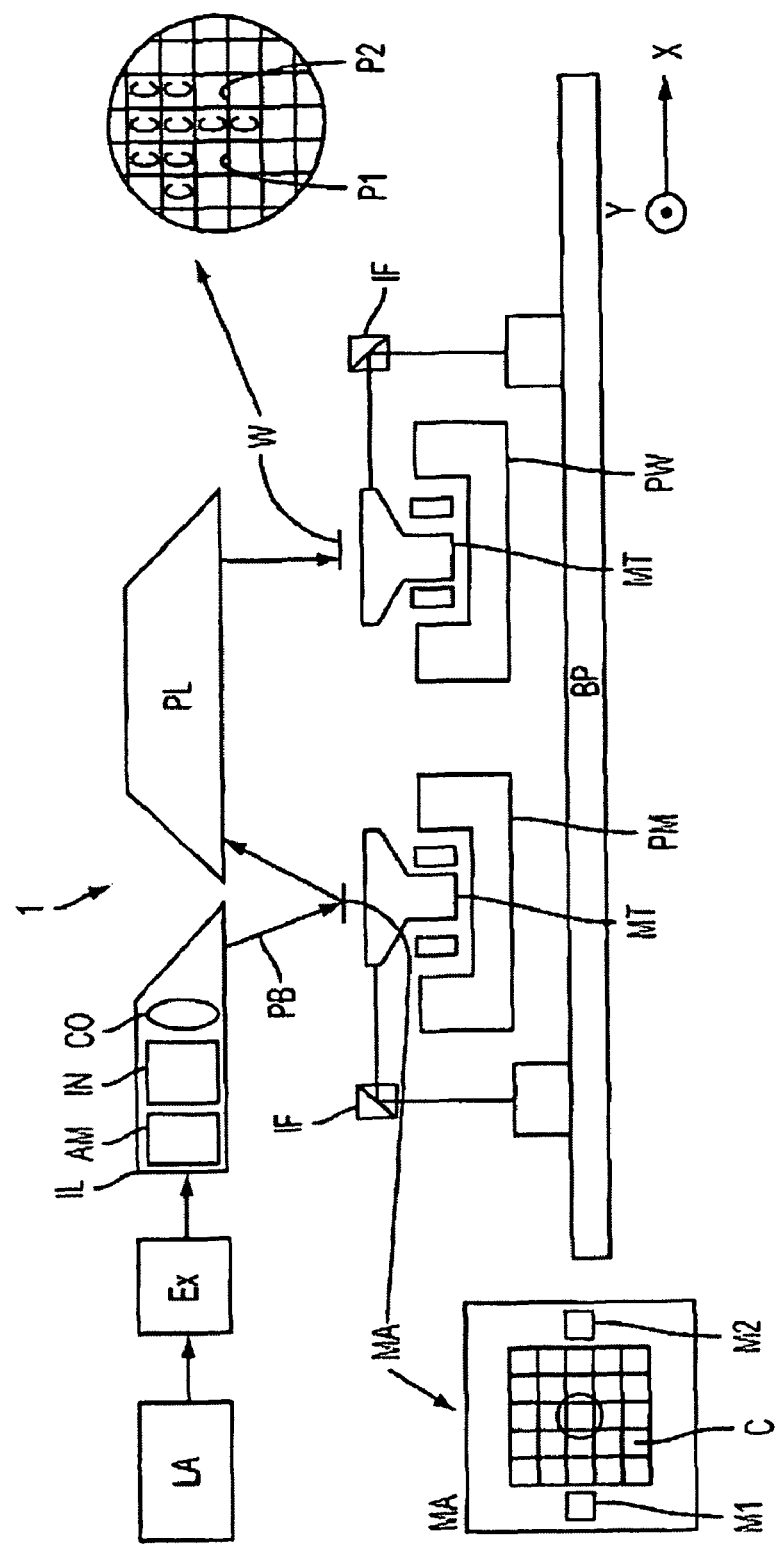
FIG. 8 schematically depicts a lithographic projection apparatus suitable for use with a mask designed with the aid of an embodiment of the present invention.

FIG. 8 schematically depicts a lithographic projection apparatus suitable for use with a mask designed with the aid of the current invention. The apparatus comprises:
- a radiation system Ex, IL, for supplying a projection beam PB of radiation. In this particular case, the radiation system also comprises a radiation source LA;
- a first object table (mask table) MT provided with a mask holder for holding a mask MA (e.g., a reticle), and connected to first positioning means for accurately positioning the mask with respect to item PL;
- a second object table (substrate table) WT provided with a substrate holder for holding a substrate W (e.g., a resist-coated silicon wafer), and connected to second positioning means for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 8 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 8. However, in the case of a wafer stepper (as opposed to a step-and-scan tool) the mask table MT may just be connected to a short-stroke actuator, or may be fixed.

The depicted tool can be used in two different modes:
In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;
In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of obtaining short-range flare model parameters representing a short-range flare which degrades a contrast of an image generated by a lithography tool, comprising the steps of:
    projecting radiation through a mask using the lithography tool to generate the image containing short-range flare;
    measuring the short-range flare from the image to obtain measured short-range flare data;
    generating a simulated image corresponding to the image generated by the lithography tool using short-range flare model parameters to obtain simulated short-range flare data;
    comparing the simulated short-range flare data with the measured short range flare data;
    determining whether the short-range flare model parameters used in the simulation is appropriate based on the comparison result; and
    changing the values of the short-range flare model parameters used for generating the simulated image according to the measured short-range data and the simulated short-range flare data if the short-range flare model parameters used for the simulation is not appropriate.

2. The method according to claim 1, wherein the step of measuring short-range flare utilizes one of a disappearing box test and a sensor based test.

3. The method according to claim 1, wherein the step of performing the simulation includes the steps of providing initial short-range flare model parameters for the first time of the simulation, and performing the simulation based on the initial short-range flare model parameters to generate initial simulated short-range flare data for comparison with the measured short-range flare data.

4. The method according to claim 1, wherein the step of changing the short-range flare model parameter values includes utilizing a genetic algorithm to generate new set of the short-range flare model parameters based on the measured short-range data and the simulated short-range flare data, and providing the new set of the short-range flare model parameters to the step of performing the simulation.

5. A method for performing a lithography simulation, comprising the steps of:
    obtaining optimized short-range flare model parameters according to claim 1; and
    performing a lithography simulation in consideration of the optimized short-range flare model parameters.

6. A method for performing a lithography simulation, comprising the steps of:
    obtaining optimized short-range flare model parameters for a reference lithography system according to claim 1; and
    performing proximity matching to match the Optical Proximity Effect (OPE) of a given a lithography system to the OPE of the reference lithography system in consideration of the optimized short-range flare model.

7. The method according to claim 1, wherein the optimized short-range flare model parameters are adapted to be incorporated into a power spectral density characterization that is used in a simulator for simulating the imaging performance of the lithographic tool and that is used to generate the simulated image.

8. The method according to claim 7, wherein the optimized short-range flare model parameters comprise ABC model parameters for the power spectral density characterization.

9. A computer program product comprising a computer readable storage medium bearing a computer program for obtaining short-range flare model parameters representing a short-range flare which degrades a contrast of an image generated by a lithography tool, the computer program, when executed, causing a computer to perform the steps of:
    receiving data corresponding to the image containing short-range flare which has been generated by projecting radiation through a mask using the lithography tool;
    receiving measured short-range flare data that has been obtained by measuring the short-range flare in the image;
    generating a simulated image corresponding to the image generated by the lithography tool using short-range flare model parameters to obtain simulated short-range flare data;
    comparing the simulated short-range flare data with the measured short range flare data;
    determining whether the short-range flare model parameters used in the simulation is appropriate based on the comparison result; and
    changing the values of the short-range flare model parameters used for generating the simulated image according to the measured short-range data and the simulated short-range flare data if the short-range flare model parameters used for the simulation is not appropriate.

10. The computer program product according to claim 9, wherein the step of measuring short-range flare utilizes one of a disappearing box test and a sensor based test.

11. The computer program product according to claim 9, wherein the step of performing the simulation includes the steps of providing initial short-range flare model parameters for the first time of the simulation, and performing the simulation based on the initial short-range flare model parameters to generate initial simulated short-range flare data for comparison with the measured short-range flare data.

12. The computer program product according to claim 9, wherein the step of changing the short-range flare model parameter values includes utilizing a genetic algorithm to generate new set of the short-range flare model parameters based on the measured short-range data and the simulated short-range flare data, and providing the new set of the short-range flare model parameters to the step of performing the simulation.

13. An apparatus for obtaining short-range flare model parameters representing a short-range flare which degrades a contrast of an image generated by a lithography tool, the apparatus comprising:
    a first unit configured for measuring short-range flare from the image to obtain measured short-range flare data, wherein the image containing the short-range flare is generated by projecting radiation through a mask using the lithography tool;
    a second unit configured for generating a simulated image corresponding to the image generated by the lithography tool using short-range flare model parameters to obtain simulated short-range flare data;

a third unit configured for comparing the simulated short-range flare data with the measured short range flare data;

a fourth unit configured for determining whether the short-range flare model parameters used in the simulation is appropriate based on the comparison result; and a fifth unit configured for changing the values of the short-range flare model parameters used for generating the simulated image according to the measured short-range data and the simulated short-range flare data if the short-range flare model parameters used for the simulation is not appropriate.

14. The apparatus according to claim 13, wherein the first unit utilizes one of a disappearing box test and a sensor based test to measure the short-range flare.

15. The apparatus according to claim 13, wherein the second unit is further configured for receiving initial short-range flare model parameters for the first time of the simulation, and performing the simulation based on the initial short-range flare model parameters to generate initial simulated short-range flare data for comparison with the measured short-range flare data.

16. The apparatus according to claim 13, wherein the fifth unit utilizes a genetic algorithm to generate new set of the short-range flare model parameters based on the measured short-range data and the simulated short-range flare data, and provides the new set of the short- range flare model parameters to the second unit.

* * * * *